United States Patent
Li et al.

(10) Patent No.: US 8,531,323 B2
(45) Date of Patent: Sep. 10, 2013

(54) PIPELINED ANALOG-TO-DIGITAL CONVERTER AND ITS SINGLE REDUNDANCY BIT DIGITAL CORRECTION TECHNIQUE

(75) Inventors: Ting Li, Nan'an District (CN); Yuxin Wang, Nan'an District (CN); Xiaofeng Shen, Nan'an District (CH); Shutao Zhou, Nan'an District (CN); Tao Liu, Nan'an District (CN); Mingyuan Xu, Nan'an District (CN); Ruzhang Li, Nan'an District (CN); Kaiquan He, Nan'an District (CN)

(73) Assignee: No. 24th Research Institute of China Electronics Technology Group Corp, Chongqing (CN)

(*) Notice: Subject to any disclaimer, the term of this patent is extended or adjusted under 35 U.S.C. 154(b) by 111 days.

(21) Appl. No.: 13/142,367

(22) PCT Filed: Jun. 21, 2010

(86) PCT No.: PCT/CN2010/074136
§ 371 (c)(1),
(2), (4) Date: Aug. 5, 2011

(87) PCT Pub. No.: WO2010/149002
PCT Pub. Date: Dec. 29, 2010

(65) Prior Publication Data
US 2011/0279295 A1    Nov. 17, 2011

(30) Foreign Application Priority Data
Jun. 22, 2009 (CN) .......................... 2009 1 0104133

(51) Int. Cl.
*H03M 1/06* (2006.01)

(52) U.S. Cl.
USPC .............................. 341/118; 341/155; 341/161

(58) Field of Classification Search
USPC .................. 341/155, 156, 144, 161, 117–120
See application file for complete search history.

(56) References Cited

U.S. PATENT DOCUMENTS

| 5,635,937 A * | 6/1997 | Lim et al. ...................... 341/161 |
| 6,295,016 B1 * | 9/2001 | Chiang ........................... 341/161 |
| 7,158,066 B2 * | 1/2007 | Lee .................................. 341/144 |
| 7,397,409 B2 * | 7/2008 | Jeon et al. ...................... 341/156 |
| 7,486,216 B2 * | 2/2009 | Lee et al. ....................... 341/161 |
| 2009/0135037 A1 | 5/2009 | Agarwal et al. |

FOREIGN PATENT DOCUMENTS

| CN | 1691514 A | 11/2005 |
| CN | 101355363 A | 1/2009 |
| CN | 101582696 A | 11/2009 |

* cited by examiner

*Primary Examiner* — Jean B Jeanglaude
(74) *Attorney, Agent, or Firm* — Merchant & Gould P.C.

(57) ABSTRACT

A pipeline A/D converter and its single redundancy bit digital correction are provided. The single redundancy bit digital correction includes the following steps: substages except for the last one quantizes input voltage, calculates the residual voltage, which is amplified and shifted to the middle part of the reference voltage range, and outputs to the following substage until the last one, which only quantizes the input voltage; the code and offset code of each substage corresponding to the quantized thermometer code are calculated; the offset codes of all stages are added by weight to get total offset code; and codes of all substages are added by weight, to which the total offset code is added. The comparator offset error is corrected to obtain an output code which identifies the negative or positive overflow of input signals. The A/D converter adopting the above digital correction is provided.

18 Claims, 5 Drawing Sheets

US 8,531,323 B2

PIPELINED ANALOG-TO-DIGITAL CONVERTER AND ITS SINGLE REDUNDANCY BIT DIGITAL CORRECTION TECHNIQUE

This application is a National Stage Application of PCT/CN2010/074136, filed 21 Jun. 2010, which claims benefit of Serial No. 200910104133.2, filed 22 Jun. 2009 in China and which applications are incorporated herein by reference. To the extent appropriate, a claim of priority is made to each of the above disclosed applications.

FIELD OF INVENTION

The present invention relates to the technical field of analog-to-digital converters, to be more specific, a pipeline A/D converter and a single redundancy bit digital correction technique for the converter.

BACKGROUND

The circuit structure of A/D converter includes successive approximation, integral, full parallel (flash), subranging, pipeline and Δ-Σ over-sampling. The main structure for high speed and high resolution A/D converter is the pipeline structure.

The concept of pipeline structure was introduced in 1987 by S. H. Lewis, et al, in which, lower resolution A/D converters was pipelined to realize a high resolution A/D converter. Based on the pipeline A/D converter, B. Ginetti, et al. introduced, in 1990, the theory of redundancy bit to realize a 1.5-bit/stage pipeline structure, which is widely used at present. In this structure, each pipelined stage has 1 significant bit and 1 redundancy bit, and each stage outputs one of three (00, 01, 10) codes. The output of all substages are properly delayed, and then sent to code reconstruction circuit for addition of overlapped bits, to generate the corrected output code. The structure corrects comparator offset errors by using redundancy bit and digital correction circuit, which is widely used in pipeline A/D converters. However, when used for high speed and high resolution A/D converters, this structure and the related digital correction method presented some problems: 1) the output voltage range of each substage occupies the full range of reference voltage [$Vref_-$, $Vref_+$], leaving no spare reference voltage range for introducing negative and positive redundancy bit codes; so, when input signal is smaller than $Vref_-$, the output is all 0; and when input signal is greater than $Vref_+$, the output is all 1. That is to say, the corrected output code can not identify the negative or positive overflow of the input signal; 2) the number of pipeline stages equals to A/D converter bits minus one. The more bits the converter has, the more pipeline stages there will be. Take 16-bit A/D converter as an example, when the pipeline structure of 1.5-bit/stage is used, then 15 pipeline stages will be needed, which greatly increases layout area and power consumption, compared to 8- and lower-bit A/D converter with the same structure; 3) the input/output delay time, which is directly proportional to the number of pipeline stages, increases with increasing stages.

As for the conventional digital correction method for comparator offset error, the structure of (n+0.5)-bit per stage is derived from the theory of 1.5-bit per stage, i.e. each pipeline stage inputs n bits of effective data and 1 redundancy, and outputs corresponding binary codes ranging from 0 to ($2^{n+1}-1$). And the output of each stage is sent to code reconstruction circuit for addition of overlapped bits after a reasonable delay. When the conventional method is applied to digital correction of high speed and high resolution A/D converter, there exists the same problem, i.e. this method does not introduce negative and positive redundancy codes, so, it cannot identify underflow or overflow of the input signal.

Therefore, the existing conventional correction method need improving. It is essential to introduce negative and positive redundancy codes to identify underflow and overflow of input signals, while the number of stages is reduced.

SUMMARY

It is an object of the present invention to reduce the number of pipeline stages and to guarantee enough reference voltage range for identifying negative and positive overflows of the input signals for the pipeline A/D converter.

The pipeline A/D converter comprises an S/H circuit, a code reconstruction circuit and m substages (m≥2);

The S/H circuit receives input signal and outputs it to the first substage;

Each of the previous m−1 substages quantizes input voltage to generate quantized thermometer code, and calculate its corresponding analog voltage, which is then subtracted from the input voltage to generate a residual voltage. The residual voltage is amplified and shifted to the middle of the reference voltage range. It is then output to the following substage.

The m-th substage quantizes the input signal to generate a quantized thermometer code;

Each substage outputs both code and offset code corresponding to its quantized thermometer code to code reconstruction circuit;

the code reconstruction circuit corrects errors introduced by comparator offset according to code and offset code of each stage, to produce the corrected output code.

Then, each of the previous m−1 substages comprises a multiplying digital-to-analog converter, a code and offset code distribution circuit;

Wherein the multiplying D/A converter contains a flash A/D converter, a D/A converter, a residual error amplifier, the first and second adders;

a flash A/D converter, comprising a voltage-divided resistor cluster and a comparator array connected to it, quantizing input voltage to obtain a quantized thermometer code, D/A converter converts quantized thermometer code into analog voltage;

The first adder subtracts the analog voltage from input voltage to generate a residual voltage;

the residual error amplifier amplifies the residual voltage by a factor of $G_i$, $G_i=2^{B_i}$, where $B_i$ is the effective number of bits;

The second adder adds $$\frac{1}{2}(Vref_+ + Vref_-)$$

to the amplified residual voltage, namely, shift the amplified residual voltage to the middle of reference voltage range and outputs it to the following substage.

a code and offset code distribution circuit calculates and outputs the code and offset code according to the quantized thermometer code;

Then, the ith D/A converter carries out the following operation to convert the quantized thermometer code into an analog voltage:

$$A_i = f(D_i) = Vref_- + (Vref_+ - Vref_-) \times \frac{2D_i + 1}{2CN(i)};$$

Where, $A_i$ is the analog voltage corresponding to the quantized thermometer code of the substage; $Vref_-$ and $Vref_+$ are voltage values across the reference voltage range, respectively, $D_i$ is the quantized thermometer code in the ith substage, $$D_i = \sum_{k=1}^{CN(i)} D_i(k),\ 1 \leq i \leq (m-1),$$

where m is the number of substages, $D_i(k)$ is the output value of the kth comparator in the ith substage; and $CN(i)$ is the number of quantized thermometer codes in the ith substage, Then, the mth substage contains a flash A/D converter and a code/offset-code distribution circuit. The flash A/D converter quantizes input voltage to generate quantized thermometer code. The code/offset-code distribution circuit calculates and outputs code and offset code according to the quantized thermometer code;

Then, except the first substage, the related codes includes negative redundancy codes, effective codes and positive redundancy codes;

And then, each substage has a resolution redundancy bit.

The present invention also offers a single redundancy bit digital correction method for high speed and high resolution A/D converter, which solves issues of increased layout area, power consumption and input/output delay time due to excessive pipeline stages required, as well as the inability to identify negative and positive overflows of input signals.

the foregoing pipeline A/D converter contains at least two substages. The single-bit digital correction method for the foregoing pipeline A/D converter follows the steps below:

1) Quantizing input voltage of each substage to produce quantized thermometer code and calculates its corresponding analog voltage, which is the quantized voltage; subtracting the quantized voltage from the input voltage to generate a residual voltage, which is amplified and shifted to the middle of the reference voltage range, and then output to the following substage;

All substages except the last one executes the above steps consecutively, until the voltage is output to the last substage;

The last substage quantizes the input voltage to produce the quantized thermometer code;

2) Defining code and offset code corresponding to quantized thermometer code of each substage.

3) Adding up offset codes of each substage by weight to generate total offset code.

4) Adding up codes of all stages and the total offset code to correct comparator offset induced errors of the pipeline A/D converter to generate corrected output codes.

Then, resolution of the A/D converter is assigned to each substage before step 1), and step 1) is described as follows: quantizing input voltage of the first substage to produce quantized thermometer code, and calculate its corresponding analog voltage, which is quantized voltage; subtracting the quantized voltage from input voltage to generate a residual voltage; amplifying and shifting the residual voltage to the middle of the reference voltage range to generate output voltage of the first substage, which is sent to the second substage; and repeating this process until the voltage is output to the last substage.

and the last substage does not produce residual voltage.

And then, in the foregoing step 1), the output voltage range of all substages except the last one only occupies half of the reference voltage range.

And in the foregoing step 1), the analog voltage corresponding to quantized thermometer code in the ith substage is calculated with the following equation:

$$A_i = f(D_i) = Vref_- + (Vref_+ - Vref_-) \times \frac{2D_i + 1}{2CN(i)};$$

where, $A_i$ is the analog voltage corresponding to quantized thermometer code in the ith substage; $Vref_-$ and $Vref_+$ are values across the reference voltage range, respectively, $D_i$ is the quantized thermometer code of the ith substage, $$D_i = \sum_{k=1}^{CN(i)} D_i(k),$$

$1 \leq i \leq (m-1)$, where m is the total number of substages; $D_i(k)$ is the output value of the kth comparator of the ith substage. $CN(i)$ is the number of quantized thermometer codes in the ith substage, $CN(i) = 2^{B_i+1}$.

And in step 1), the output voltage of the ith substage is expressed as:

$$V_{out(i)} = (V_{in(i)} - A_i)G_i + \frac{1}{2}(Vref_+ + Vref_-);$$

where $V_{out(i)}$ is the output voltage of the ith substage, $G_i$ is the multiplying factor of the residual error in the ith substage ($G_i = 2^{B_i}$, $1 \leq i \leq (m-1)$), $Vref_-$ and $Vref_+$ are values across the reference voltage range, respectively.

And, in step 2), the code corresponding to quantized thermometer code of the ith substage is a binary code of $B_i+1$ bit corresponding to quantized thermometer code, where $B_i$ is the effective number of output bits of the ith substage.

And, all codes except those in the first substage comprise negative redundancy codes, effective codes and positive redundancy codes.

And, the first ¼ of codes in the coding sequence is negative redundancy codes, the ½ of codes in the middle is effective codes, and the last ¼ of codes is positive redundancy codes.

And, in step 2), the output offset code of the ith substage is:

$$\begin{cases} 0, & i = 1 \\ -\frac{2^{B_i+1}}{4}, & 2 \leq i \leq m; \end{cases}$$

Then, in the foregoing step 4), also included in the front of the most significant bit of the corrected output code is the overflow bit, which is used to identify the negative or positive overflows of input signals.

The present invention has the following advantages:

(1) significant reduction of substages of high speed and high resolution pipeline A/D converter. For example, a 16-bit A/D converter needs 15 pipeline stages when 1.5-bit/stage structure is used, whereas only 5 stages are required if 3 effective bits plus 1 redundancy bit structure described in the present invention is used, reducing the total substages by 67%. In the present invention, the number of comparators is increased, but the number of amplifiers is significantly reduced. It is the amplifier that consumes layout area and power. Therefore, the present invention greatly cut down layout area, power consumption and input/output delay.

(2) According to the present invention, the output voltage range of each substage occupies only a half of the reference voltage range [Vref_, Vref_+]. The other half of the reference voltage range is used for negative and positive redundancy codes. While, in the conventional digital correction technique, the output voltage range occupies the full reference voltage range, not allowing for negative and positive redundancy codes.

(3) The present invention proposes for the first time the coding method introducing negative and positive redundancy codes. When corrected with the proposed technique in the present invention, the pipeline A/D converter has overflow bits that are capable of identifying both negative and positive overflows, namely bidirectional overflows, which is not possible for the conventional digital correction method.

(4) The present invention introduces offset codes, which makes it possible to denote positive numbers with negative redundancy codes, thus relaxing the complexity of computing circuit, since plus adder circuit is simpler than minus adder circuit.

(5) According to the present invention, high speed A/D converters with flash structure are used for each substage, and all substages are pipelined. Therefore, pipeline A/D converters using the foregoing correction method features both high speed of flash structure and high resolution of pipeline structure.

The invention, together with other advantages, objects and features thereof, will be related in the succeeding embodiments and may be best understood by referring to the following description of the presently preferred embodiments, together with the accompanying drawings

DETAILED DESCRIPTION OF THE PREFERRED EMBODIMENT

The embodiments of the present invention are described in detail and illustrated with attached drawings.

Figure 2:
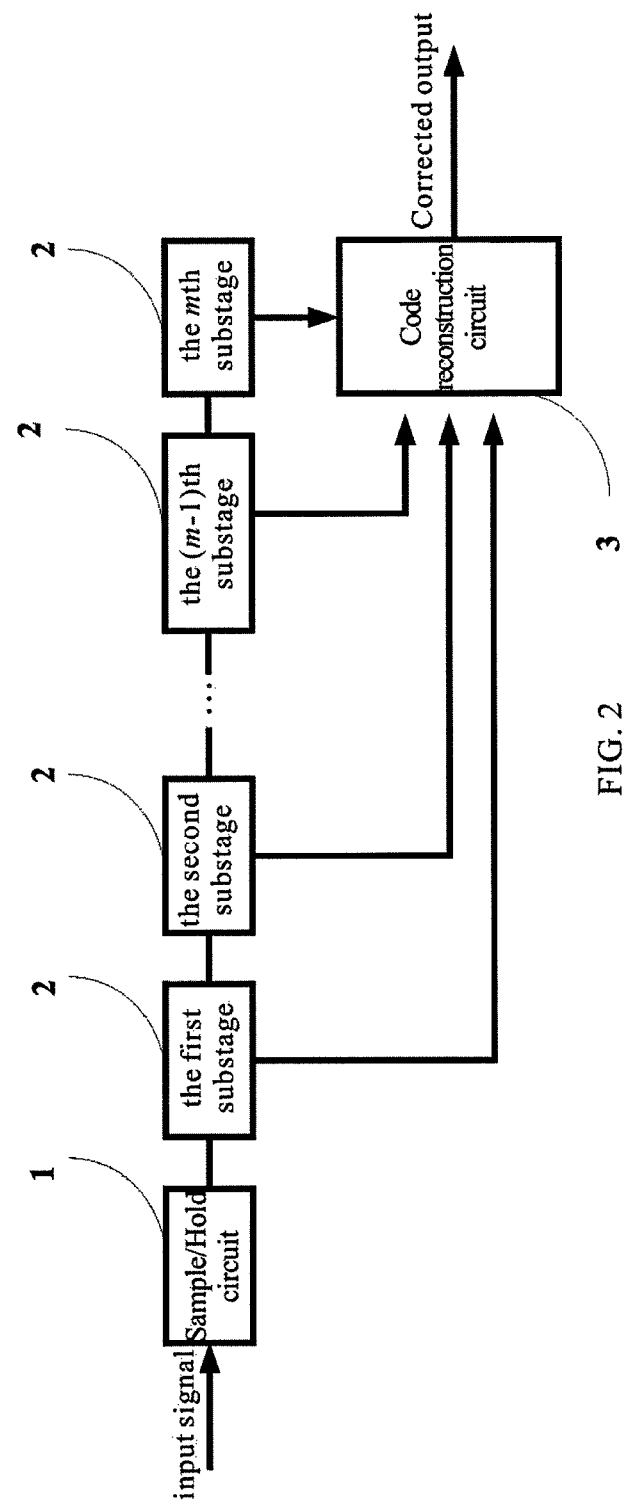
FIG. 2 is block diagram of the pipeline A/D converter circuit in the present invention.

FIG. 2 shows details of overall structure of a pipeline A/D converter, which comprises a sample-and-hold circuit 1, m (m≧2) substages 2 and a code reconstruction circuit 3. The external input signal is sent to the first substage via sample-and-hold circuit 1. Each of the previous m−1 substages quantizes input voltage to generate quantized thermometer code. Then the corresponding analog voltage is calculated. The analog voltage is subtracted from the input voltage to generate residual voltage, which is amplified and shifted to the middle of the reference voltage range, and output to the following substage. Repeat the cycle to the last substage, i.e. the mth substage, which does not produce residual voltage. Meanwhile, each substage also defines code and offset code corresponding to its quantized thermometer code. The code and offset code is properly delayed and sent to code reconstruction circuit 3. Correct comparator induced offset errors to generate output code.

Figure 3:
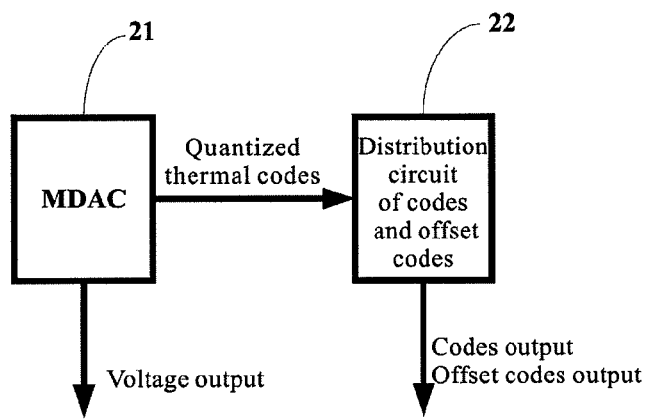
FIG. 3 is circuit diagram showing one of the previous m−1 substages of the pipeline A/D converter in the present invention.
Figure 4:
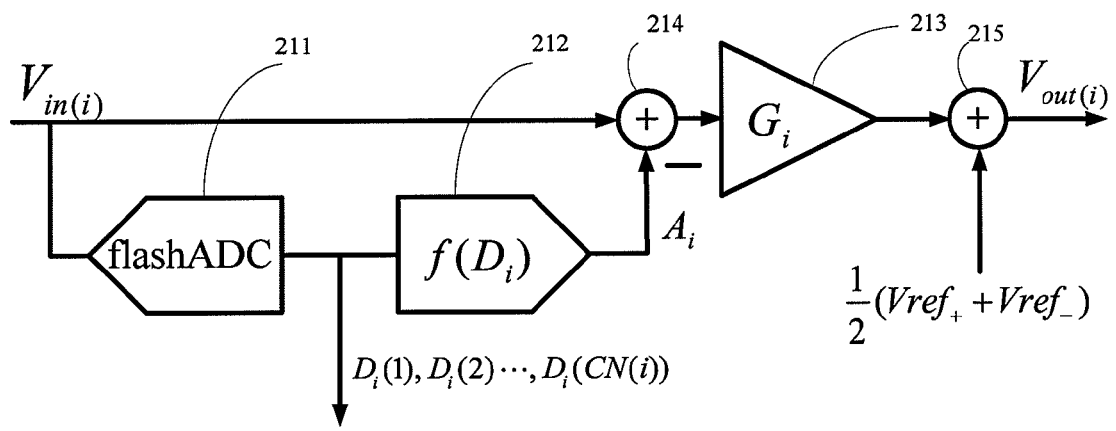
FIG. 4 is MDAC circuit structure of the pipeline A/D converter in the present invention.

As shown in FIG. 3, each of the previous m−1 substages comprises a Multiplying Digital to Analog Converter (MDAC) 21 and a code and offset code distribution circuit 22; As shown in FIG. 4, a Multiplying D/A Converter comprises a flash analog to digital converter (flash ADC) 211, a D/A converter 212 with transfer function of f ($D_i$), a residual amplifier 213 with a multiplying factor of $G_i$ and two adders 214, 215; a flash analog-to-digital converter 211 comprises a voltage-divide resistor cluster 2111 and a comparator array 2112 connected to the resistor cluster. The input voltage $V_{in(i)}$ of the ith substage is quantized to produce the quantized thermometer code of $D_i(1), D_i(2), \ldots, D_i(CN(i))$. A D/A converter 212 converts the quantized thermometer code into analog voltage 4. The first adder 214 subtracts the analog voltage from the output voltage $V_{in(i)}$ of the ith substage to obtain a residual voltage ($V_{in(i)}-A_i$); A residual amplifier 213 amplifies the residual voltage by $G_i$ times, where $G_i=2^{B_i}$, $B_i$ is the number of effective bits output from the ith substage. The second adder 215 adds $$\frac{1}{2}(Vref_+ + Vref_-)$$

to the amplified residual voltage, namely, it shifts the amplified residual voltage to the middle of reference voltage range and output to the following substage. Code and offset code distribution circuit 22 calculates and outputs the code and offset code according to quantized thermometer code, which is the thermometer code output from a flash A/D converter. Each substage has a fixed offset code.

Figure 6:
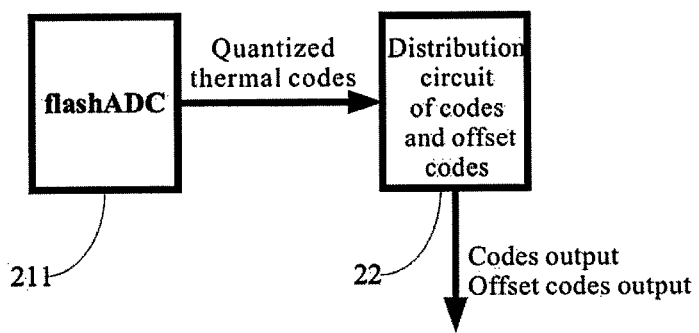
FIG. 6 is the circuit structure of the mth substage of the pipeline A/D converter in the present invention.

As shown in FIG. 6, the mth substage comprises a flash A/D converter 211 and a code and offset code distribution circuit 22. The flash A/D converter 211 quantizes input voltage to produce a quantized thermometer code. The code and offset code distribution circuit 22 calculates and outputs codes and offset codes according to the quantized thermometer code.

Figure 1:
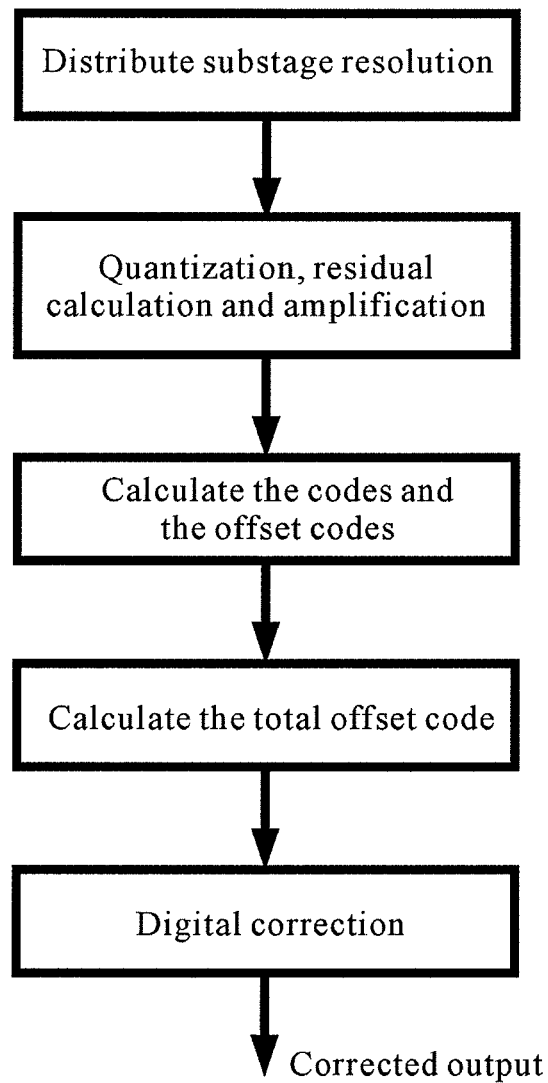
FIG. 1 is a flow chart of the single redundancy bit digital correction method for pipeline A/D converter in the present invention.

The single redundancy bit digital correction technique for pipeline A/D converter presented in the present invention is especially suitable for high-speed and high-resolution A/D converter. FIG. 1 shows a flow chart of the present invention. A detailed embodiment is described as follows:

1) Assign resolution of the pipeline A/D converter to each substage.

The value of m in FIG. 2 depends on actual resolution of A/D converter. For instance, assuming an m of 5 and an identical resolution for the previous (m−1) substages (generally, the resolution of substage can be chosen from 2 to 5), a 16-bit A/D converter has the structure of (4+4+4+4+4) with 1 redundancy bit in each stage, namely, the redundancy resolution is 1; assuming an m of 4 and an identical resolution for the previous (m−1) substages, the A/D converter has the structure of (5+5+5+4) with 1 redundancy bit in each stage; in this example, m can be any other value, and the resolution of each substage can be different, but the redundant resolution of each substage is always 1.

2) quantizing input voltage of the substage to generate quantized thermometer code, and calculating analog voltage corresponding to quantized thermometer code, wherein the foregoing analog voltage corresponding to quantized thermometer code is the quantized voltage, which is subtracted from input voltage to generate a residual voltage. The residual voltage is then amplified and shifted to the middle of the reference voltage range, and output to the following substage.

All substages except the last one execute the following step consecutively, until the voltage is output to the last substage: quantizing input voltage of the first substage to get a quantized thermometer code; calculating analog voltage corresponding to quantized thermometer code to generate quantized voltage, which is subtracted from the input voltage to get a residual voltage. The residual voltage is then amplified and shifted to the middle of the reference voltage range to produce output voltage of the first substage, which is then sent to the second substage; repeat the cycle until the voltage is output to the last substage, namely, the mth substage, which does not produce residual voltage, but quantizes its input voltage to get quantized thermometer code.

Hereinafter, the embodiment of an MDAC is described:

(a) First of all, flash ADC quantizes the input signal of substages, and outputs the quantized thermometer code.

Figure 5:
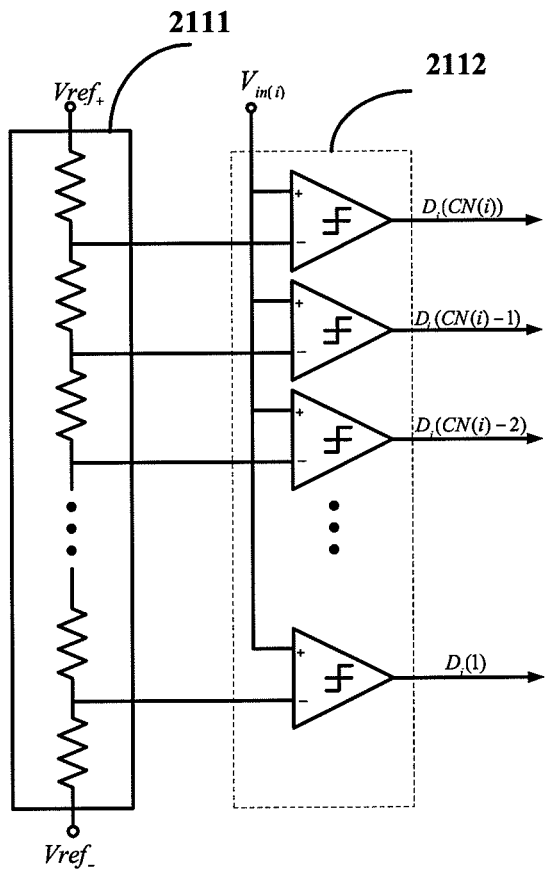
FIG. 5 is the circuit structure of flash A/D converter for the pipeline A/D converter in the present invention.

FIG. 5 is a circuit diagram showing the structure of the flash ADC in FIG. 4, which comprises a cluster of voltage-divide resistors and a comparator array. If the ith substage, where $1 \leq i \leq m$, has an output effective bits of $B_i$, a redundancy bit of 1 and a total resolution of $(B_i+1)$, the number of the corresponding quantized ranges, namely, the number of quantized thermometer codes, is:

$$CN(i)=2^{B_i+1} \quad (1)$$

The number of comparators in the ith substage is:

$$2^{B_i+1}-1 \quad (2)$$

In the ith substage, the number of resistors in the voltage-divide resistor cluster, is $2^{B_i+1}$. The reference voltage range of [Vref_, Vref_+] is divided into $2^{B_i+1}$ quantized ranges of the same size. The output of the ith substage, i.e. the quantized thermometer codes output from comparator array of the flash ADC in the ith substage is $D_i(1), D_i(2), \ldots, D_i(CN(i))$.

(b) Secondly, the quantized thermometer code of the flash ADC is converted into corresponding analog signal $A_i$.

$A_i$ is defined as a midpoint voltage of the quantized range where the input signal of the ith substage is. If the output of the kth comparator of the ith substage is $D_i(k)$ (when positive input voltage of the comparator is greater than negative input voltage, the output is 1, otherwise, it is 0), then:

$$A_i = f(D_i) = Vref_- + (Vref_+ - Vref_-) \times \frac{2D_i + 1}{2CN(i)} \quad (3)$$

Where, $A_i$ is the analog voltage corresponding to quantized thermometer code in the ith substage; Vref_ and Vref_+ are values across the reference voltage range, respectively, $D_i$ is a quantized thermometer code, where $$D_i = \sum_{k=1}^{CN(i)} D_i(k)$$

and $1 \leq i \leq (m-1)$, m is the number of substages, $D_i(k)$ is a logic value output by the kth comparator of the ith substage.

(c) Lastly, subtracting $A_i$ from the input signal $V_{in(i)}$. The difference is amplified by residual amplifier, and shifted to the middle of the reference voltage range of [Vref_, Vref_+], and then sent to the following substage.

$$V_{out(i)} = (V_{in(i)} - A_i)G_i + \frac{1}{2}(Vref_+ + Vref_-) \quad (4)$$

Where $V_{out(i)}$ is the output voltage of the ith substage, $G_i$ is the residual amplifying factor of the ith substage: $G_i = 2^{B_i}$, $1 \leq i \leq (m-1)$, Vref_ and Vref_+ are values across the reference voltage range, respectively.

$$G_i = 2^{B_i}, 1 \leq i \leq (m-1) \quad (5)$$

Shown in FIG. 6 is the circuit structure of the mth substage described in FIG. 2 in the present invention. It comprises a flash A/D converter and a code/offset-code distribution circuit, wherein the flash A/D converter operates as in the foregoing step (a).

3) Defining code and offset-code corresponding to quantized thermometer code of each substage.

(a) Code Defining

If the thermometer code output from the flash A/D converter in the ith substage is $D_i(1), D_i(2), \ldots, D_i(CN(i))$, then the codes are $(B_i+1)$ bits of binary codes corresponding to $D_i$ in Equation (3).

Ideally, since $A_i$, where $1 \leq i \leq (m-1)$, always corresponds to the middle-point voltage of each quantized range, therefore, $|V_{in(i)} - A_i|$ is smaller than or equal to half width of the quantized range (the interval voltage of comparators), i.e.

$$|V_{in(i)} - A_i| \leq \frac{1}{2} \times \frac{(Vref_+ - Vref_-)}{CN(i)} - \frac{1}{2CN(i)}(Vref_+ - Vref_-) \leq \quad (6)$$

$$(V_{in(i)} - A_i) \leq \frac{1}{2CN(i)}(Vref_+ - Vref_-)$$

From Equations (4), (5) and (6), it may be derived:

$$-\frac{1}{4}(Vref_+ - Vref_-) + \frac{1}{2}(Vref_+ + Vref_-) \leq \quad (7)$$

$$V_{out(i)} \leq \frac{1}{4}(Vref_+ - Vref_-) + \frac{1}{2}(Vref_+ + Vref_-)$$

According to Eq. (7), the range of the output voltage $V_{out(i)}$ of the ith substage, namely the input voltage of the (i+1)th substage, is symmetric about the middle-point value $$\frac{1}{2}(Vref_+ + Vref_-)$$

of two reference voltages, i.e. the output voltage range is distributed over the two $$\frac{1}{4}(Vref_+ - Vref_-)$$

ranges next to the middle point $$\frac{1}{2}(Vref_+ + Vref_-),$$

while codes are corresponding to the full reference voltage range [Vref_-, Vref_+], namely, the two $$\frac{1}{2}(Vref_+ - Vref_-)$$

ranges next to the middle point of $$\frac{1}{2}(Vref_+ + Vref_-).$$

Therefore, in the (i+1)th substage, the previous $$\frac{1}{4}CN(i)$$

codes are negative redundancy codes, the middle $$\frac{1}{2}CN(i)$$

codes are effective codes and the last $$\frac{1}{4}CN(i)$$

codes are positive redundancy codes. Obviously, the number of redundancy codes and that of effective codes are identical, also, the number of positive redundancy codes and the number of negative redundancy codes are the same. The positive and negative redundancy codes are used to correct errors introduced by comparator offset. Ideally, the codes corresponding to input signal range are effective codes, codes smaller than the effective code are negative redundancy codes, and codes greater than the effective code are positive redundancy codes.

The input voltage range of the first substage is identical with the reference voltage range, therefore, codes of the first substage exclude redundancy codes.

(b) Defining Offset Codes

For the first substage, the input signal range is identical with the reference voltage range, which is over the two ranges of $$\frac{1}{2}(Vref_+ - Vref_-)$$

next to $$\frac{1}{2}(Vref_+ + Vref_-),$$

so the offset code is 0.

For the ith substage (2≦i≦m), ideally, input signals, namely the output voltage $V_{out(i-1)}$ of the previous substage, are only distributed over the two ranges of $$\frac{1}{4}(Vref_+ - Vref_-)$$

next to $$\frac{1}{2}(Vref_+ + Vref_-),$$

so, codes should be counted from 0 at the beginning of the second quarter of the reference voltage range. But actually, codes are counted starting from the first quarter of the reference voltage range, which means the actual code is offset by a quarter range, so, the offset code is $$-\frac{2^{B_i+1}}{4}.$$

Therefore, offset code output from the ith substage is:

$$\begin{cases} 0, & i = 1 \\ -\frac{2^{B_i+1}}{4}, & 2 \le i \le m \end{cases} \quad (8)$$

4) The offset codes are added by weight to give total offset codes.

The offset codes of each substage are added by weight to give total offset codes $S_oS_nS_{n-1}, S_{n-2} \ldots S_3S_2S_1$ (binary complementary code), where n is the resolution of A/D converter, and $S_o$ is symbol bit.

5) The codes of each substage are added by weight, and the result is added to the total offset code; and correct errors introduced by comparator offset to generate corrected output codes.

The correction range of offset voltage of the comparator in the ith substage is:

$$V_{os} = \pm \frac{1}{2} \frac{Vref_+ - Vref_-}{2^{B_i+1}} \quad (9)$$

Figures 7, 8:
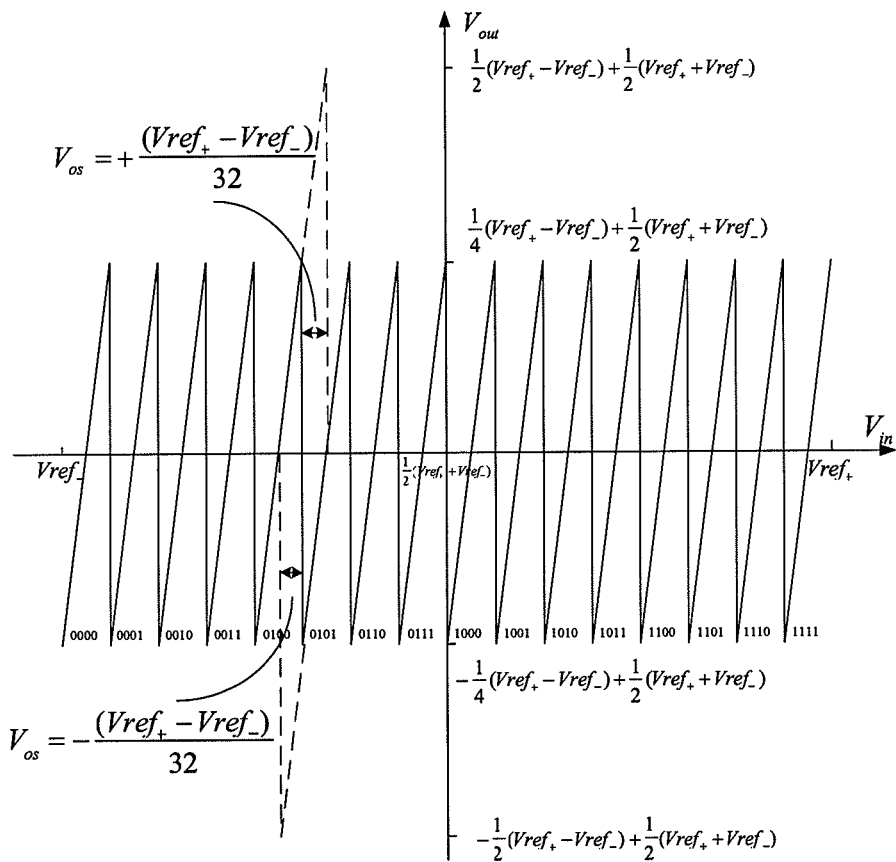
FIG. 7 is logic diagram of the code reconstruction circuit in the single redundancy bit digital correction method for pipeline A/D converter in the present invention.
FIG. 8 is a schematic showing details of transfer functions of substages 1 to 4 and their corresponding codes in the embodiments of the present invention.

FIG. 7 shows a logic diagram of code reconstruction described in the present invention. Here, $D_o$ is introduced prior to MSB $D_n$ of the output code as an overflow mark bit. When input signal is smaller than Vref_- or greater than Vref_+, $D_o=1$; when input signal is between two reference voltages, $D_o=0$. Since the binary total offset code corresponding to each actual A/D converter is a fixed value, it can be built into code reconstruction circuit by designing, thus eliminating recalculation for each correction.

Theory of the correction is described as follows: if only the ith substage has comparator offset error, the code corresponding to quantized thermometer code will be 1 smaller or 1 greater than the actual value. When codes in the ith stage are 1 smaller than the ideal value, the corresponding analog signal $A_i$ is also 1 quantized level smaller than the actual value (comparator interval voltage on ideal condition). Therefore, 1 quantized level is subtracted from the input signal of the substage, so that the output voltage $V_{out(i)}$ of the ith substage is 1 quantized level larger, and even $V_{out(i)}$ is quantized in the following substage, the output code is also $G_i$ larger than the ideal value. Codes and offset codes output from all substages are added by weight to generate output codes, which are identical with output codes of the ith substage without comparator offset (the ideal output codes). It is otherwise true, when codes of the ith substage are 1 larger than the ideal value. In conclusion, the more the previous substages quantize, the less the latter substages quantize, and vice versa. Codes and offset codes output from substages are added by weight, and errors introduced by comparator offset are corrected to give corrected output codes.

The present invention is applied to a 16-bit A/D converter fabricated in conventional hybrid IC process. The correction process of the A/D converter is as follows:

1) In Case of No Overflow

With a 16-bit A/D converter as an example, assuming reference voltage as $Vref_-$ and $Vref_+$, and let $Vref=Vref_+-Vref_-$, the input is:

$$V_{in} = Vref_- + \frac{12345}{2^{16}} Vref$$

(a) if an ideal 16-bit A/D converter, namely, a 16-bit A/D converter without comparator offset errors, is adopted for quantization, the output code is binary code corresponding to 12345: 0011 0000 0011 1001.

(b) using the structure and digital correction method proposed in the present invention, assuming that the number of substages m is 5, and adopting the structure of (4+4+4+4+4), i.e. each substage comprises 3 effective data bits and 1 redundancy bit, the transfer function of substages 1 to 4 is illustrated in FIG. 8. When the A/D converter has comparator offset error and the comparator offset error is less than $$\pm \frac{(Vref_+ - Vref_-)}{32},$$

according to Eqs. (3), (4), (5) and (8), the quantization process of each substage is as follows:

the output code of the first substage: 0010 (the ideal output is 0011, assuming that the comparator offset of the first substage makes output code slightly smaller)

output voltage of the first substage:

$$V_{out(1)} = \frac{2105}{8192} Vref + \frac{1}{2}(Vref_+ + Vref_-)$$

output code of the second substage: 1011 (the ideal output is 1100, assuming that the comparator offset of the second substage makes output code slightly smaller)

output voltage of the second substage:

$$V_{out(2)} = \frac{313}{1024} Vref + \frac{1}{2}(Vref_+ + Vref_-)$$

output code of the third substage: 1101 (the ideal output is 1100, assuming that the comparator offset of the third substage makes the output code slightly larger)

output voltage of the third substage:

$$V_{out(3)} = -\frac{39}{128} Vref + \frac{1}{2}(Vref_+ + Vref_-)$$

output code of the fourth substage: 0010 (the ideal output is 0011, assuming that the comparator offset of the fourth substage makes output code slightly smaller)

output voltage of the fourth substage:

$$V_{out(4)} = \frac{5}{16} Vref + \frac{1}{2}(Vref_+ + Vref_-)$$

output code of the fifth substage: 1101 total offset code: 1 1111 0110 1101 1100 total code: 0 0011 1001 0101 1101 output code after correction: 0 0011 0000 0011 1001 (the highest bit is overflow bit)

In the foregoing instance, the overflow bit is 0, which indicates that the input signal does not exceed the reference voltage range. In cases (a) and (b), output codes are the same. Obviously, in the previous (m−1) substages, errors induced by comparator offset can be corrected, and the corrected output code is consistent with the quantized output code of an ideal 16-bit A/D converter. To correct comparator offset induced error of the last substage, a low resolution substage, such as a substage with a total resolution of 2, can be added to completely eliminate errors induced by comparator offset.

2) In Case of Negative Overflow

With 16-bit A/D converter as an example, assuming that the reference voltage is $Vref_-$ and $Vref_+$, and let $Vref=Vref_+-Vref_-$, the input is $$V_{in} = Vref_- - \frac{1}{65536} Vref$$

(a) Using an ideal 16-bit A/D converter, namely, a 16-bit A/D converter without comparator offset error, for quantization, where $V_{in}<Vref_-$, the ideal quantized output should be negative overflow.

(b) using the structure and digital correction method proposed in the present invention, assuming that the number m of substages is 5, and adopting the structure of (4+4+4+4+4), i.e. each substage comprises 3 effective data bits and 1 redundancy bit, the transfer function of substages 1 to 4 and the corresponding coding diagram are illustrated in FIG. 8. For comparator offset error less than $$\pm \frac{(Vref_+ - Vref_-)}{32},$$

from Equations (3), (4), (5) and (8), the quantization process of each substage can be derived (this is also true for positive overflow):

output code of the first substage: 0000 (with comparator offset error, output codes corresponding to this input remain unchanged)

output voltage of the first substage:

$$V_{out(1)} = -\frac{2049}{8192} Vref + \frac{1}{2}(Vref_+ + Vref_-)$$

output codes of the second substage: 0100 (the ideal output is 0011, assuming that the comparator offset of the second substage makes output code slightly larger)

output voltage of the second substage:

$$V_{out(2)} = -\frac{257}{1024} Vref + \frac{1}{2}(Vref_+ + Vref_-)$$

output code of the third substage: 0100 (the ideal output is 0011, assuming that the comparator offset of the third substage makes output code slightly larger)

output voltage of the third substage:

$$V_{out(3)} = -\frac{33}{128} Vref + \frac{1}{2}(Vref_+ + Vref_-)$$

output code of the fourth substage: 0100 (the ideal output is 0011, assuming that the comparator offset of the fourth substage makes output code slightly larger)

output voltage of the fourth substage:

$$V_{out(4)} = -\frac{5}{16} Vref + \frac{1}{2}(Vref_+ + Vref_-)$$

output code of the fifth substage: 0011
total offset code: 1 1111 0110 1101 1100
total code: 0 0000 1001 0010 0011
corrected output code: 1 1111 1111 1111 1111 (MSB is overflow bit)

In the foregoing instance, the overflow bit is 1, which indicates that the input signal exceeds the reference voltage range. Obviously, output code corrected with the proposed method in the present invention is identical with that of an ideal 16-bit A/D converter. Therefore, negative overflow of the input signal can be identified with overflow bit in the present invention, even when substages have comparator offset errors.

Similarly, from $$V_{in} = Vref_+ + \frac{1}{65536} Vref,$$

it can be seen the overflow bit can correctly identify positive overflow of the input signal when substages have comparator offset errors.

The foregoing preferred embodiments are not going to limit the present invention. Obviously, bearing the essence and concept of the present invention, technologists in this field can make various changes and redesigns to the present invention. If the changes and redesigns remain with the claims of the present invention and is included in the equivalent technology area, the present invention intends to include these changes and redesigns.

What is claimed is:

1. A pipeline A/D converter, comprising Sample/Hold (S/H) circuit, code reconstruction circuit and m substages (m≥2), wherein an S/H circuit for receiving external input signal and outputting it to the first substage;

a previous m−1 substages for quantizing input voltages to obtain thermometer code, calculating its corresponding analog voltage; subtracting it from input voltage to get residue voltage, which is amplified and shifted to the middle of reference voltage range, and then outputting to the following substage;

an mth substage for quantizing its input signal to obtain a thermometer code;

each substage also outputs code and offset code corresponding to quantized thermometer code to a code reconstruction circuit;

a code reconstruction circuit for correcting comparator-offset induced errors, according to code and offset code of each stage, to generate corrected output code.

2. A pipeline A/D converter according to claim 1, wherein each stage of the previous m−1 substages comprises a multiplying D/A converter and a code/offset code distribution circuit, and a multiplying D/A converter comprising a flash A/D converter, a D/A converter, a residual error amplifier, first adder and second adder, and a flash A/D converter, comprising a voltage-divided resistor cluster and a comparator array connected to it, quantizing input voltage to obtain a quantized thermometer code, and a D/A converter for converting the quantized thermometer code into an analog voltage, and first adder for subtracting the analog voltage from input voltage to obtain a residual voltage, and a residual error amplifier for amplifying the residual voltage by a factor of $G_i$, $G_i = 2^{B_i}$, where $B_i$ is the number of effective bits, and second adder for adding the amplified residual voltage to $$\frac{1}{2}(Vref_+ + Vref_-),$$

namely, the amplified residual voltage is shifted to the middle of the reference voltage and output to the following substage, and a code and offset code distribution circuit for calculating and outputting the code and offset code according to the quantized thermometer code.

3. A pipeline A/D converter according to claim 2, wherein the ith D/A converter carries out the following operation to convert the quantized thermometer code into analog voltage:

$$A_i = f(D_i) = Vref_- + (Vref_+ - Vref_-) \times \frac{2D_i + 1}{2CN(i)}$$

where $A_i$ is the analog voltage corresponding to quantized thermometer code in the ith substage, $Vref_-$ and $Vref_+$ are voltage values across the reference voltage range, respectively, $D_i$ is the quantized thermometer code in the ith substage, $$D_i = \sum_{k=1}^{CN(i)} D_i(k),$$

$1 \leq i \leq (m-1)$, where m is the number of substages, $D_i(k)$ is the output value of the kth comparator in the ith substage; CN(i) is the number of quantized thermometer codes in the ith substage, $CN(i) = 2^{B_i + 1}$.

4. A pipeline A/D converter according claim 1, wherein the mth substage comprises a flash A/D converter and a code and offset code distribution circuit; the flash A/D converter quantizes input voltage to obtain a quantized thermometer code; according to the quantized thermometer code, code and offset code distribution circuit calculates and outputs codes and offset codes.

5. The pipeline A/D converter according to claim 4, wherein, except the first substage, the related codes comprises negative redundancy codes, effective codes and positive redundancy codes.

6. The pipeline A/D converter according to claim 1, wherein each substage has one bit of resolution redundancy.

7. A single redundancy bit digital correction technique for the pipeline A/D converter, which contains two substages at least, is described as follows:
1) input voltage of each substage is quantized to produce a quantized thermometer code and its corresponding analog voltage; the quantized voltage, namely the foregoing analog voltage corresponding to the quantized thermometer code, is subtracted from the input voltage to obtain a residual voltage, which is amplified and shifted to the middle of reference range, and outputs to the following substage, and
the rest substages except for the last one execute the foregoing step consecutively until the voltage is output to the last substage, and
the last substage quantizes the input voltage to produce a quantized thermometer code;
2) define the code and offset code corresponding to its respective quantized thermometer code in each substage;
3) add up offset codes of each substage by weight to obtain a total offset code;
4) all the codes and the total offset code are added up, and the comparator offset induced error in the pipeline A/D converter is corrected to get the corrected output code.

8. The single redundancy bit digital correction technique for the pipeline A/D converter according to claim 7, wherein resolution of the pipeline A/D converter is assigned to each substage before step 1).

9. The single redundancy bit digital correction technique for the pipeline A/D converter according to claim 7, wherein step 1) is described as follows: input voltage to the first substage is quantized to produce a quantized thermometer code, and its corresponding analog voltage is calculated, i.e. to generate a quantized voltage, which is subtracted from input voltage to get a residual voltage; the residual voltage is then amplified and shifted to the middle of reference voltage range to generate output voltage of the first substage, which is sent to the second substage, and it goes on and on, until the voltage is output to the last substage, which quantizes its input voltage to get a quantized thermometer code.

10. The single redundancy bit digital correction technique for the pipeline A/D converter according to claim 9, wherein the last substage does not produce a residual voltage.

11. The single redundancy bit digital correction technique for the pipeline A/D converter according to claim 7, wherein, in the foregoing step 1), the output voltage range of all substages except the last one only occupies half of the reference voltage range.

12. The single redundancy bit digital correction technique for the pipeline A/D converter according to claim 11, wherein, in the foregoing step 1), the analog voltage corresponding to the quantized thermometer code in the ith substage is calculated with the following expression:

$$A_i = f(D_i) = Vref_- + (Vref_+ - Vref_-) \times \frac{2D_i + 1}{2CN(i)};$$

where, $A_i$ is the analog voltage corresponding to its quantized thermometer code in the ith substage, $Vref_-$ and $Vref_+$ are values across the reference voltage range, respectively, $D_i$ is the quantized thermometer code in the ith substage, $$D_i = \sum_{k=1}^{CN(i)} D_i(k),$$

$1 \leq i \leq (m-1)$, where m is the number of substage. $D_i(k)$ is the output value of the kth comparator in the ith substage, CN(i) is the number of quantized thermometer codes in the ith substage, $CN(i) = 2^{B_i + 1}$.

13. The single redundancy bit digital correction technique for the pipeline A/D converter according to claim 7, wherein, in the foregoing step 1), the output voltage of the ith substage is:

$$V_{out(i)} = (V_{in(i)} - A_i)G_i + \frac{1}{2}(Vref_+ + Vref_-);$$

where, $V_{out(i)}$ is the output voltage of the ith substage, $G_i$ is the multiplying factor of the residual error of the ith substage ($G_i = 2^{B_i}$, $1 \leq i \leq (m-1)$), $Vref_-$ and $Vref_+$ are values across the reference voltage range, respectively.

14. The single redundancy bit digital correction technique for the pipeline A/D converter according to claim 7, wherein, in the foregoing step 2), the code corresponding to the quantized thermometer code of the ith substage is the binary code of bit $B_i + 1$ corresponding to the quantized thermometer code, where $B_i$ is the number of effective output bits of the ith substage.

15. The single redundancy bit digital correction technique for the pipeline A/D converter according to claim 14, wherein codes in all substages except the first one comprise negative redundancy codes, effective codes and positive redundancy codes.

16. The single redundancy bit digital correction technique for the pipeline A/D converter according to claim 15, wherein the first quarter (¼) of codes in the coding sequence is negative redundancy code, one half (½) of codes in the middle is effective code, and the last one fourth (¼) of codes is positive redundancy code.

17. The single redundancy bit digital correction technique for the pipeline A/D converter according to claim 7, wherein, in step 2), the output offset code of the ith substage is expressed as:

$$\begin{cases} 0, & i = 1 \\ -\dfrac{2^{B_i+1}}{4} & 2 \leq i \leq m° \end{cases}.$$

18. The single redundancy bit digital correction technique for the pipeline A/D converter according to claim 7, wherein, in step 4), also included before the most significant bit (MSB) of the corrected output code is the overflow bit, which is used to identify the negative or positive overflow of input signals.

\* \* \* \* \*